(12) United States Patent
Bankowski et al.

(10) Patent No.: US 11,005,187 B2
(45) Date of Patent: May 11, 2021

(54) ANTENNA STRUCTURE WITH METAMATERIAL

(71) Applicant: GOVERNMENT OF THE UNITED STATES, AS REPRESENTED BY THE SECRETARY OF THE ARMY, Washington, DC (US)

(72) Inventors: Elena N. Bankowski, Royal Oak, MI (US); Thomas J. Meitzler, Troy, MI (US)

(73) Assignee: Government of the United States, as Represented by the Secretary of the Army, Washington, DC (US)

( * ) Notice: Subject to any disclaimer, the term of this patent is extended or adjusted under 35 U.S.C. 154(b) by 0 days.

(21) Appl. No.: 16/554,351

(22) Filed: Aug. 28, 2019

(65) Prior Publication Data

US 2021/0066810 A1    Mar. 4, 2021

(51) Int. Cl.
*H01Q 15/00*    (2006.01)
*H01Q 1/16*    (2006.01)
(Continued)

(52) U.S. Cl.
CPC ..... *H01Q 15/0086* (2013.01); *B81C 1/00031* (2013.01); *B81C 1/00111* (2013.01);
(Continued)

(58) Field of Classification Search
CPC .... H01Q 15/0086; H01Q 1/3283; H01Q 1/16; B81C 1/00111; B81C 1/00031; B81B 2203/0361
(Continued)

(56) References Cited

U.S. PATENT DOCUMENTS 8,259,032 B1    9/2012  Buckley
8,860,159 B2   10/2014  Meitzler et al.
(Continued)

FOREIGN PATENT DOCUMENTS

CN    103296410 A    9/2013
CN    203117998 U    1/2018

OTHER PUBLICATIONS

Adams, D. (2015). Conformal Metamaterial Antennas. Charlotte, NC.
(Continued)

*Primary Examiner* — Don P Le
(74) *Attorney, Agent, or Firm* — Daniel E. Hegner; Gregory P. Gibson; Laura K. Lutz

(57) ABSTRACT

One example is an antenna structure with a metamaterial having a flexible metamaterial layer, a two-dimensional antenna layer and a spacer layer. The flexible metamaterial layer has a metamaterial thickness allowing the metamaterial layer to be attached to a curved conducting surface of a vehicle. The metamaterial layer is formed with a two-dimensional array of elements having a passive magnetic property with the array of elements formed with elongated individual elements each having a top end and a bottom end. The elongated individual elements have curved outer surfaces between the top end and the bottom end. The two-dimensional antenna layer receives electromagnetic signals. The spacer layer is located between the metamaterial layer and the antenna layer separating the metamaterial layer and the antenna layer.

20 Claims, 12 Drawing Sheets

(51) Int. Cl.
*B81C 1/00* (2006.01)
*H01Q 1/32* (2006.01)

(52) U.S. Cl.
CPC ............. *H01Q 1/16* (2013.01); *H01Q 1/3283* (2013.01); *B81B 2203/0361* (2013.01)

(58) Field of Classification Search
USPC .......................................................... 343/713
See application file for complete search history.

(56) References Cited

U.S. PATENT DOCUMENTS

| | | | | |
|---|---|---|---|---|
| 8,872,713 | B1* | 10/2014 | Buckley | H01Q 1/405 |
| | | | | 343/767 |
| 9,899,744 | B1* | 2/2018 | Contopanagos | H04B 5/0037 |
| 10,283,876 | B1* | 5/2019 | Livadaru | H01Q 15/0086 |
| 2011/0227795 | A1 | 9/2011 | Lopez et al. | |
| 2011/0260935 | A1 | 10/2011 | Bortoin et al. | |
| 2015/0054696 | A1* | 2/2015 | Werner | H01Q 15/0086 |
| | | | | 343/718 |
| 2015/0288063 | A1* | 10/2015 | Johnson | H01Q 3/24 |
| | | | | 342/352 |
| 2015/0322589 | A1 | 11/2015 | Busnaina et al. | |
| 2016/0061993 | A1* | 3/2016 | Ren | G02B 5/30 |
| | | | | 349/62 |
| 2016/0365647 | A1 | 12/2016 | Du | |
| 2017/0003389 | A1 | 1/2017 | Brady et al. | |
| 2017/0126046 | A1* | 5/2017 | Contopanagos | H01Q 1/364 |
| 2018/0138589 | A1* | 5/2018 | Clegg | H01Q 1/523 |
| 2018/0351249 | A1* | 12/2018 | Achour | H01Q 15/0086 |
| 2020/0106189 | A1* | 4/2020 | Cohen | H01Q 15/0093 |
| 2020/0335873 | A1* | 10/2020 | Achour | H01Q 13/08 |

OTHER PUBLICATIONS

Slavin, A., Meitzler, T. and Bankowski, E., 2012. Theory of a Spintronic Nano-Scale Microwave Diode for Applications in Microwave Energy Harvesting. Oakland University,Department of Physics,Andrei Slavin,Rochester, MI.,48309.

Metamaterial antenna. Retrieved May 1, 2018, from https://en.wikipedia.org/wiki/Metamaterial_antenna.

Bukva, E. (2007). Metamaterial-Based Electrically Small Antenna. Navy SBIR 2007.3-Topic N07-184, 1-2. https://www.navysbir.com/n07_3 1n073-184.htm.

Meitzler (Jun. 16, 2009). MEMS, Nanotechnology and Spintronics for Sensor Enhanced Armor, NDE and Army Applications.

* cited by examiner

ANTENNA STRUCTURE WITH METAMATERIAL

GOVERNMENT INTEREST

The inventions described herein may be made, used, or licensed by or for the U.S. Government for U.S. Government purposes. The U.S. Government has rights in the invention(s).

TECHNICAL FIELD

An antenna utilizes one or more metamaterials when forming an antenna structure. The antenna structure using metamaterial is flexible and may be mounted to metallic surfaces. In particular, the antenna structure with metamaterial may be mounted onto metallic surfaces of military vehicles, as well as other vehicles and equipment to improve, at least, antenna gain.

BACKGROUND

It may be desirable to place a conformal antenna closely adjacent to or directly onto a metallic conducting surface. However, when an antenna such as a microwave antenna array is placed directly onto on a metallic surface, the metal surface will shield electromagnetic radiation in the GHz range near the surface. The metallic surface prevents the electric field from penetrating inside the metallic surface and essentially zeroes the in-plane components of the electric field near the surface. Thus, the operation of the antenna is compromised.

SUMMARY

The following presents a simplified summary of the disclosed subject matter to provide a basic understanding of some aspects of the various embodiments. This summary is not an extensive overview of the various embodiments. It is intended neither to identify key or critical elements of the various embodiments nor to delineate the scope of the various embodiments. Its sole purpose is to present some concepts of the disclosure in a streamlined form as a prelude to the more detailed description that is presented later.

One example is an antenna structure with a metamaterial having a flexible metamaterial layer, a two-dimensional antenna layer and a spacer layer. The flexible metamaterial layer has a metamaterial thickness allowing the metamaterial layer to be attached to a conducting surface of a vehicle. The metamaterial layer is formed with a two-dimensional array of elements having a passive magnetic property. The array of elements are formed with elongated individual elements each having a top end and a bottom end. The elongated individual elements have curved outer surfaces between the top end and the bottom end. The two-dimensional antenna layer receives electromagnetic signals. The spacer layer is located between the metamaterial layer and the antenna layer separating the metamaterial layer and the antenna layer.

Another configuration includes an antenna utilizing a metamaterial adapted to be attached adjacent to a conductive layer of a vehicle. The antenna includes a metamaterial sheet, a two-dimensional antenna layer and a spacer layer. The flexible metamaterial sheet is composed of elongated elements having a passive magnetic property and curved outer surfaces between a top end and a bottom end of each element. The two-dimensional antenna layer receives and transmits electromagnetic signals. The spacer layer is located between the metamaterial layer and the antenna layer.

Another example is a method. The method allows an electromagnetic signal to pass through a two-dimensional antenna layer spaced from a flexible metamaterial layer previously placed onto a surface of a vehicle. After the electromagnetic signal passes through the antenna layer, the method allows the electromagnetic signal to reflect off of the metamaterial layer. The metamaterial layer is formed with a two-dimensional array of elements having a passive magnetic property. The electromagnetic signal is then received at the antenna layer after the electromagnetic signal is reflected from the metamaterial layer.

The following description and the annexed drawings set forth in detail certain illustrative aspects of the subject matter. However, these aspects are indicative of some of the numerous ways in which the principles of the subject matter can be employed. Other aspects, advantages, and novel features of the disclosed subject matter will become apparent from the following detailed description when considered in conjunction with the drawings. It will also be appreciated that the detailed description may include additional or alternative embodiments beyond those described in this summary.

BRIEF DESCRIPTION OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples, one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
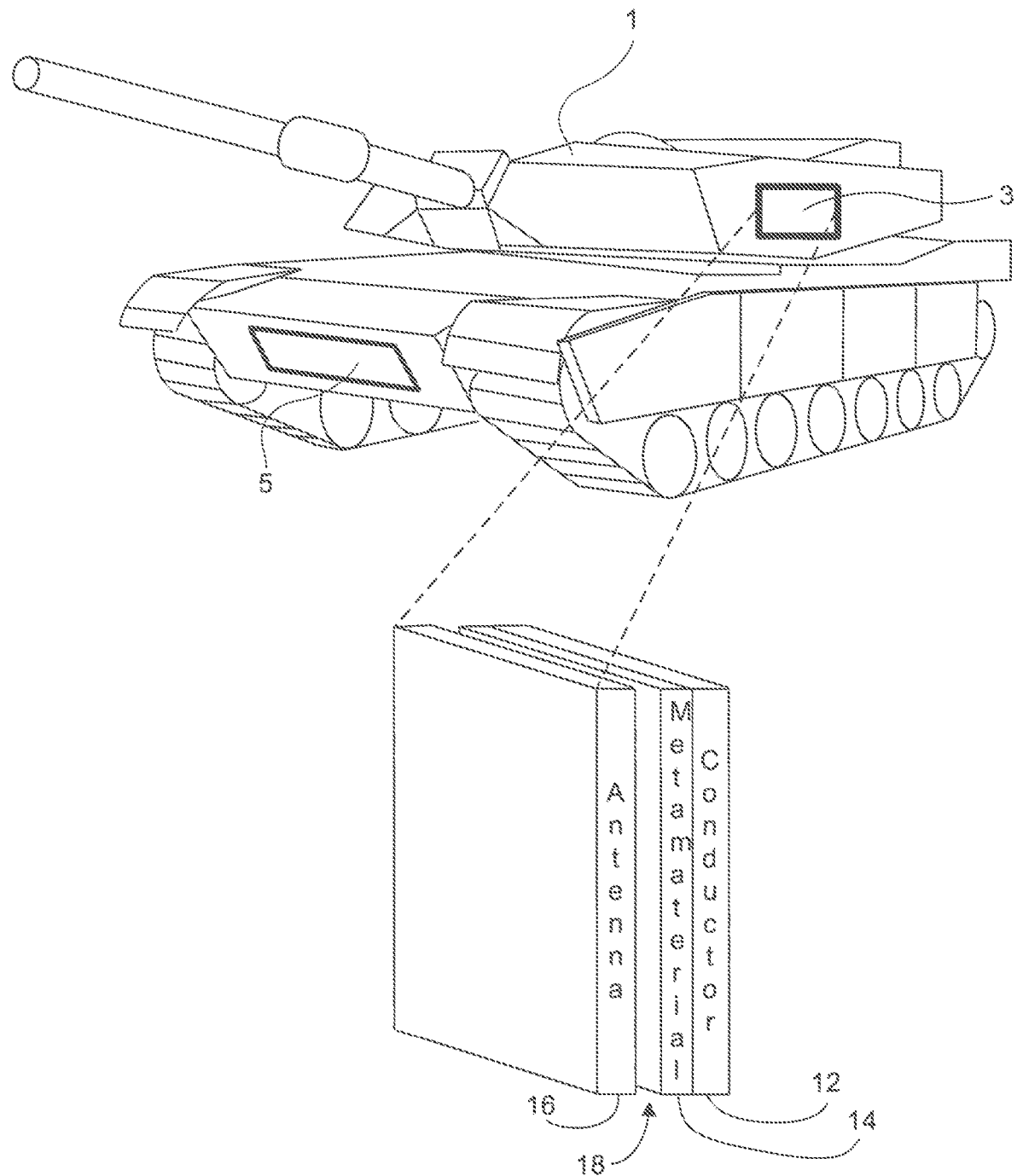
FIG. 1 illustrates an example perspective view of an embodiment of a vehicle utilizing a conformal antenna structure formed with a metamaterial.

This invention enhances the gain of a planar antenna located near a conductive surface by placing a magnetic metamaterial between the antenna and the metallic surface. FIG. 1 illustrates an example vehicle 1 with two antenna structures 3, 5 formed with metamaterials mounted to the vehicle. The antenna structures 3, 5 are formed with metamaterials are thin enough so that they are conformal vehicle antennas that are applied to and conform to a curved conductive surface of a vehicle. Additionally, the antenna structures 3, 5 formed with metamaterials amplify, more than non-metamaterial antennas, the received signals for better signal detection and recovery. While FIG. 1 illustrates an example tracked vehicle 1 resembling an Abrams tank, the vehicle may be another ground vehicle, an aircraft, a spacecraft, a marine craft, and the like. For example, one or more of the antenna structures 3, 5 formed with metamaterials may be mounted to an automobile, a sedan, a motorcycle, a commercial truck, a van, a ground combat vehicle (GCV) that may be an Abrams tank, a Bradley fighting vehicle, a Stryker vehicle, an armored personnel carrier, a high mobility multipurpose wheeled vehicle (HMMWV), a light armored vehicle (LAV), an assault amphibious vehicle, a combat support vehicle, a mine-protected vehicle, a utility vehicle, and the like.

FIG. 1 illustrates the two metamaterial antennas 3, 5 both placed on relatively flat/planer surfaces of an example tracked vehicle 1 resembling an Abrams tank. Because the components forming the antenna structures 3, 5 formed with metamaterials are rather thin, in some embodiments, one or both of the metamaterial antenna 3, 5 may be placed on curved or rounded portions of the example vehicle 1. FIG. 1 illustrates the antenna structure 5 formed with metamaterials broken out into its major components including a conductor layer 12, a metamaterial layer 14, and an antenna layer 16.

The conductor layer 12 may be the outer metallic layer to which the antenna structure 5 formed with metamaterials is being formed upon. For example, the metal layer of example FIG. 1 may be the outer steel layer of an Abrams tank or another vehicle with at least some outer metal surfaces. Preferably, the outer surface used to form the conductor layer 12 is formed with a metal that is a good electrical conductor with a good electron mobility rate. In other embodiments, the conductor layer may be formed externally of the vehicle the antenna is to be attached to and then later the metamaterial antenna, including the conductor layer may be attached to a vehicle as a single unit.

Figure 2:
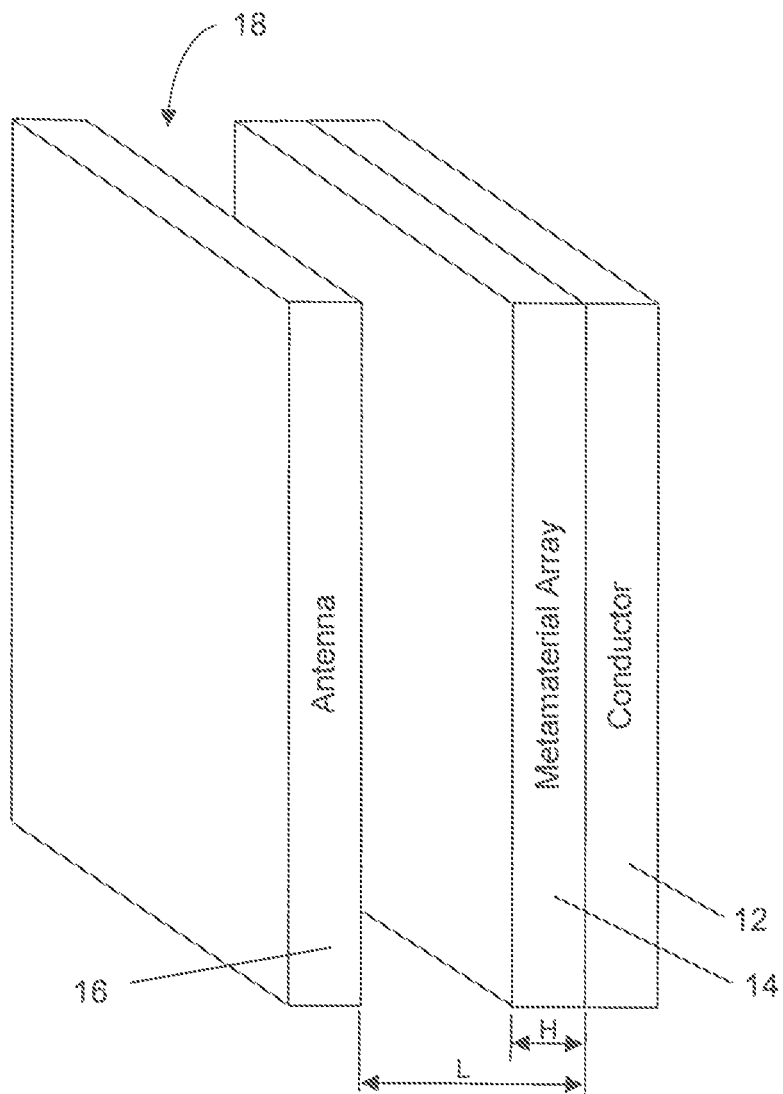
FIG. 2 illustrates a view of example layers that may form the conformal antenna structure formed with a metamaterial.

As illustrated in FIG. 1, an optional spacer layer 18 may be formed between the metamaterial layer 14 and the antenna layer 16. The spacer layer 18 may generally be a void between the metamaterial layer 14 and the antenna layer 16 containing primarily air or another material that does not absorb electromagnetic or other signals of interest that are to be captured by the antenna structure 5. As illustrated in example FIG. 2, the distance "L" between the antenna layer 16 and the conductor 12 is a distance of "L" and in some embodiments this distance is about 100 micrometers (um). In some embodiments the thickness "H" of the metamaterial layer 14 is about 10 um so that the distance between the antenna layer 16 and the conductor layer 12 is about 90 um.

The antenna layer 16 is now discussed before discussing the metamaterial layer 14. In general, the antenna layer 16 is a planer antenna designed to capture signals in the .01 to 10 GHz frequency range. In general, the antenna layer 16 is a planer antenna formed from conducting metal shaped so that it is tuned to capture one or more frequencies (e.g., signals) of interest. The shape may be any desired shape as understood by one of ordinary skill in the art.

Figure 3:
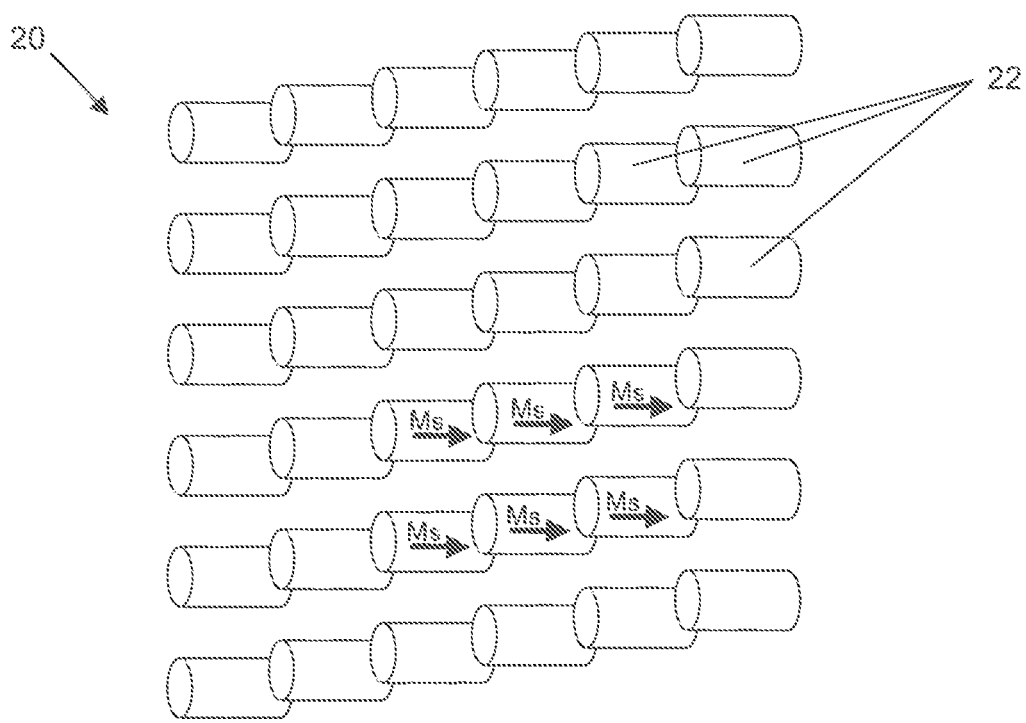
FIG. 3 illustrates an example isometric view of an array of elements forming the metamaterial layer.
Figure 4:
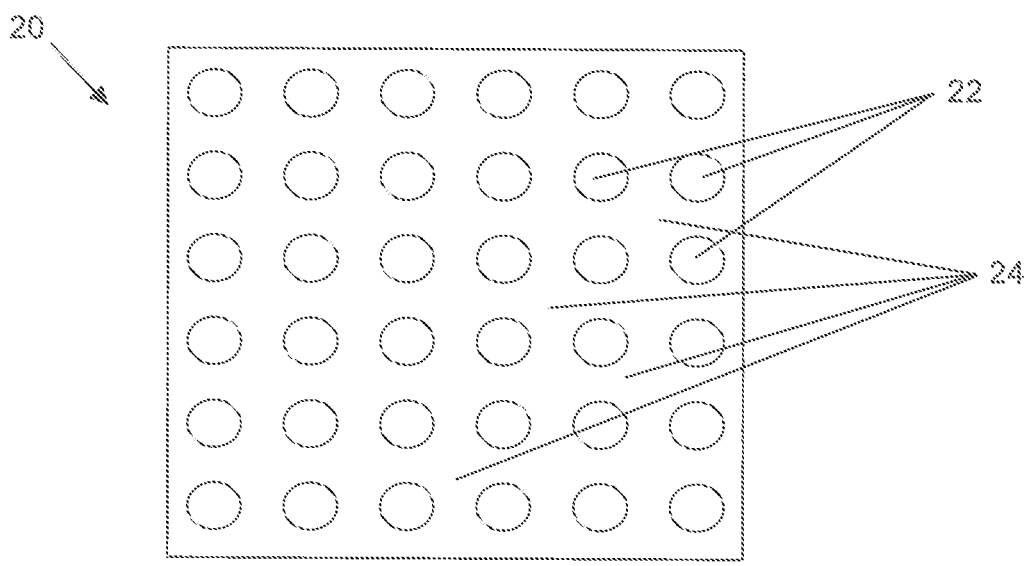
FIG. 4 illustrates an example top view of the array of elements forming the metamaterial layer.
Figure 5:
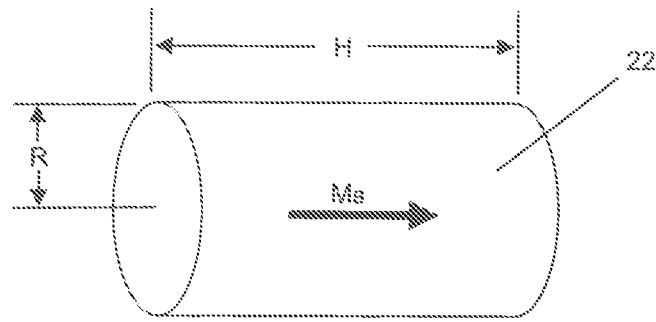
FIG. 5 illustrates an example view of one of the elements of the array forming the metamaterial layer.
Figure 6:
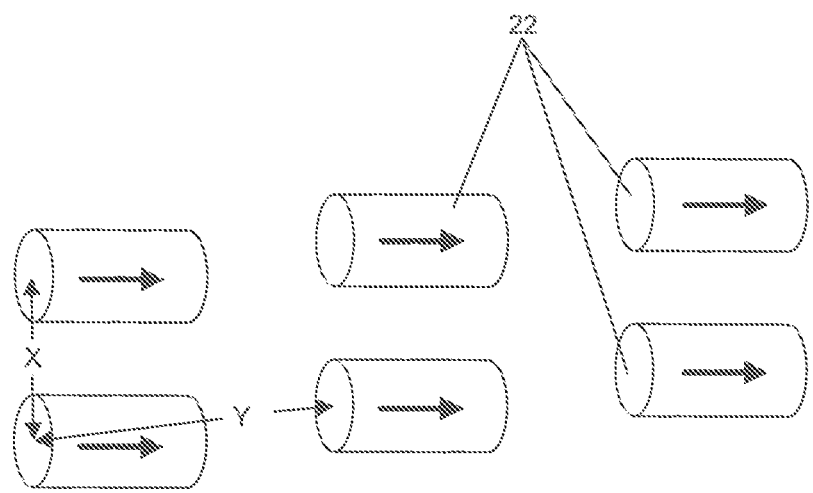
FIG. 6 illustrates an example view of the spacing of element of the array of elements forming the metamaterial layer.

FIGS. 3-6 illustrate an example metamaterial layer 14 in more detail. FIG. 3 illustrates an example portion of a metamaterial layer 14 that is an array 20 of elements 22 that are cylindrical in shape. FIG. 4 illustrates a top view of this array 20 of cylindrical elements 22. As discussed further below, the cylindrical elements 22 are constructed out of passive magnetic material(s) with the magnetic fields having saturation of magnetization values ($M_s$) of 1.02 Tesla (T) with $M_s$ vectors pointing to the right or toward the conducting layer 12. In some embodiments, the cylindrical elements 22 may be constructed as nano-pillars or nanotubes formed with NiFe and with CoFeB in a dielectric matrix around the pillars. Even though each element 22 would be formed out of the same passive magnetic material, in FIG. 3 only a few of the cylinders are labeled with magnetization value symbol $M_s$ and a vector in order to not to clutter the figure for the sake of clarity. The "height" of a cylindrical element 22 is "H" (FIG. 5) which, in the preferred embodiment is in the range of about 50 nanometers (nm). The radius of a cylindrical element is "R" which is in the range of about 10 nm. The cylindrical element 22 height, H, is substantially more (e.g., 5x) more than the radius, R. As illustrated in FIG. 6, the metamaterial elements themselves are spaced apart about 30 nm in the "X" direction and are spaced apart 100 nm about in the "Y" direction. Thus, the metamaterial elements 22 have a larger pitch in the x-direction (100 nm) vs. the y-dimension (30 nm).

In general, the metamaterial elements 22 may be manufactured out of any material or combination of materials that provide desired magnetic properties for the antenna structures 3, 5. In the preferred embodiment, the metamaterial elements 22 may be formed with a material that is about 80 percent iron and about 20 percent nickel. Another embodiment may be formed with a material that is about 80 percent iron and about 20 percent of various compositions of nickel, copper and boron. Yet another embodiment may be formed with one or more components of copper, iron, boron, NiFe (permalloy), or other desired materials and may have other/different magnetic properties and spin states. In some embodiments, the cylindrical elements 22 may be constructed as nano-pillars or nanotubes formed with NiFe and with CoFeB in a dielectric matrix around the pillars.

The metamaterial layer may be formed/fabricated with any suitable method as understood by those of ordinary skill in the art. In some embodiments, the nanomaterial layer 14 may be formed on a dielectric substrate surface and the metamaterial elements 22 and array 20 may be formed upon the dielectric substrate surface. For example, electron beam (E-beam) lithography may be used to form the metamaterial elements 22 and array 20 or portions of the elements 22 and the array 20. In some embodiments, the cylindrical elements 22 may be formed, at least in part, as nano-tubes. In some embodiments, the cylindrical shaped elements 22 will be located within another material 24 (shown in FIG. 4) that surrounds and fills voids between the cylinder shaped elements 22. This material 24 may be leftover material used in the fabrication process that is used to produce the cylinders 22 and may be non-conducting material that generally does not interfere with electromagnetic signals that the antenna structures 3, 5 formed with metamaterials are to detect.

Figure 11:
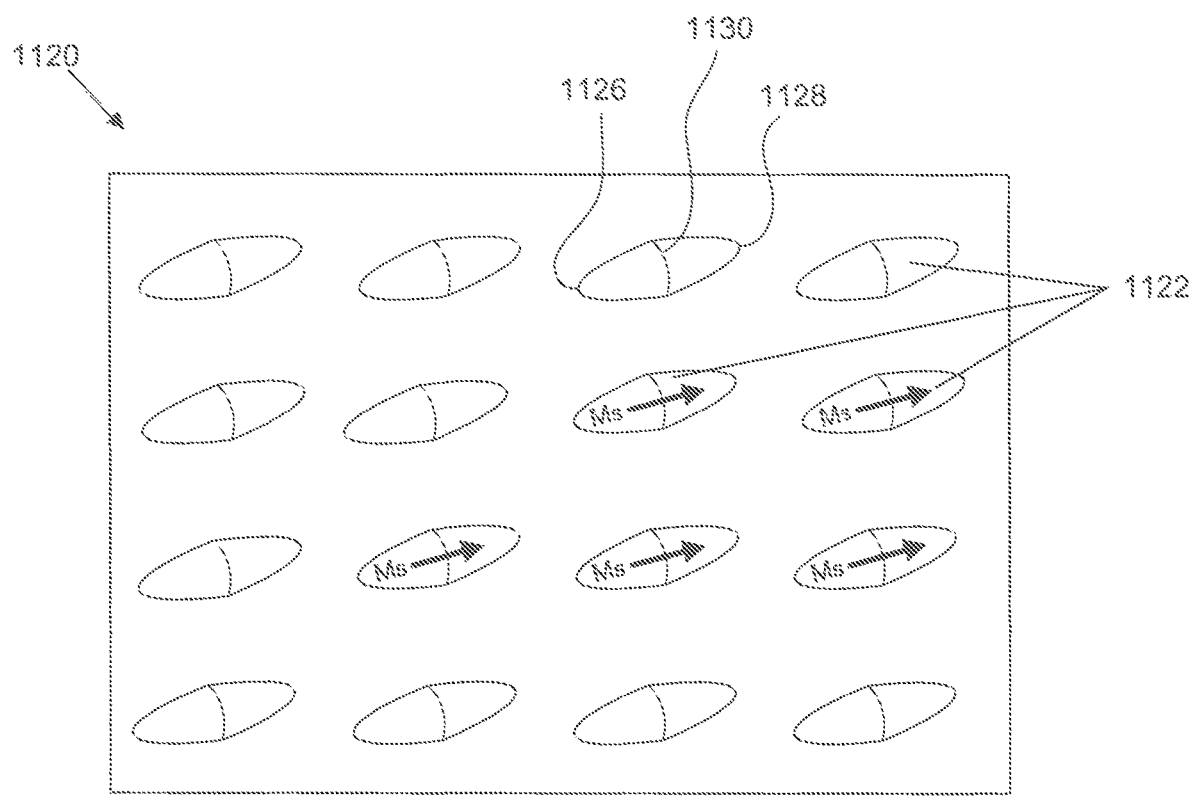
FIG. 11 an example isometric view of an array of ellipsoidal elements forming the metamaterial layer.
Figure 12:
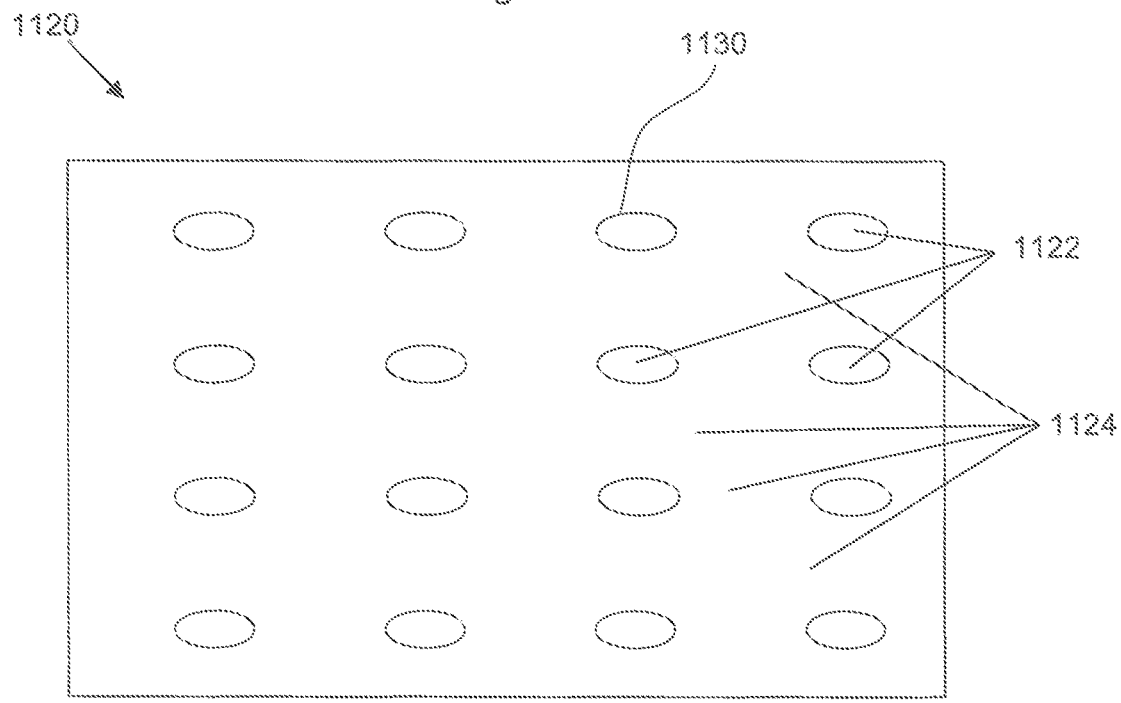
FIG. 12 illustrates an example top view of the array of ellipsoidal elements of FIG. 11 forming the metamaterial layer.

FIGS. 3-6 illustrate an example metamaterial layer 14 that is formed with cylindrical elements 22, however, in other embodiments, other shapes may be arrayed and used to create a metamaterial layer 14 that may have magnetic properties. For example, rather than being circular in cross-section, the elements 22 of the array 20 may be formed with elongated shapes that have elliptical cross sections and/or have ellipsoidal shaped outer surfaces (FIGS. 11 and 12). In other embodiments, the array of cylinders 20 may have curved domed upper and/or lower ends rather than flat ends as illustrated in FIGS. 3-6. In yet other embodiments the elements 22 of the array 24 may be "egg shaped" or another shape as desired by one of ordinary skill in the art. A cylindrical shaped metamaterial element 22 may be more optimal for detecting frequencies of 1-10 GHz, whereas ellipsoidal or egg-shaped metamaterial elements 22 are good for detecting frequencies at regions above 10 GHz.

Figure 7:
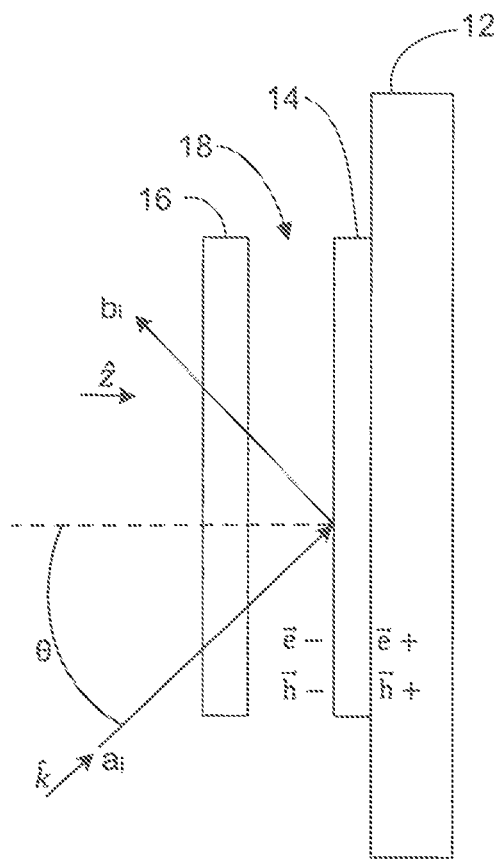
FIG. 7 illustrates an example cross-sectional view of an electromagnetic signal passing through the layers of the conformal antenna structure.

Having described the structure of the antenna structures 3, 5 formed with metamaterials of FIGS. 1-6, their use and benefits are now described. As previously mentioned, the antenna structure 5 formed with metamaterials is placed parallel to the conductor of a vehicle. Thus, as indicated in FIG. 7, the antenna structure 5 is sensitive only to the in-plane components of the electric field. The magnetic and spin directions and the metamaterial layer 14 allow the electromagnetic waves of interest to ripple through the material. In general, the metamaterial substrate 14 insulates the antenna 16 from the conducting metal surface 12 to which it is attached and effectively increases the gain of the antenna 16. The metamaterial layer 14 changes the boundary condition of the incident electromagnetic field due to the high impedance of the metamaterial. A standing wave is developed at the metamaterial antenna interface, thereby increasing the power density.

Figure 8:
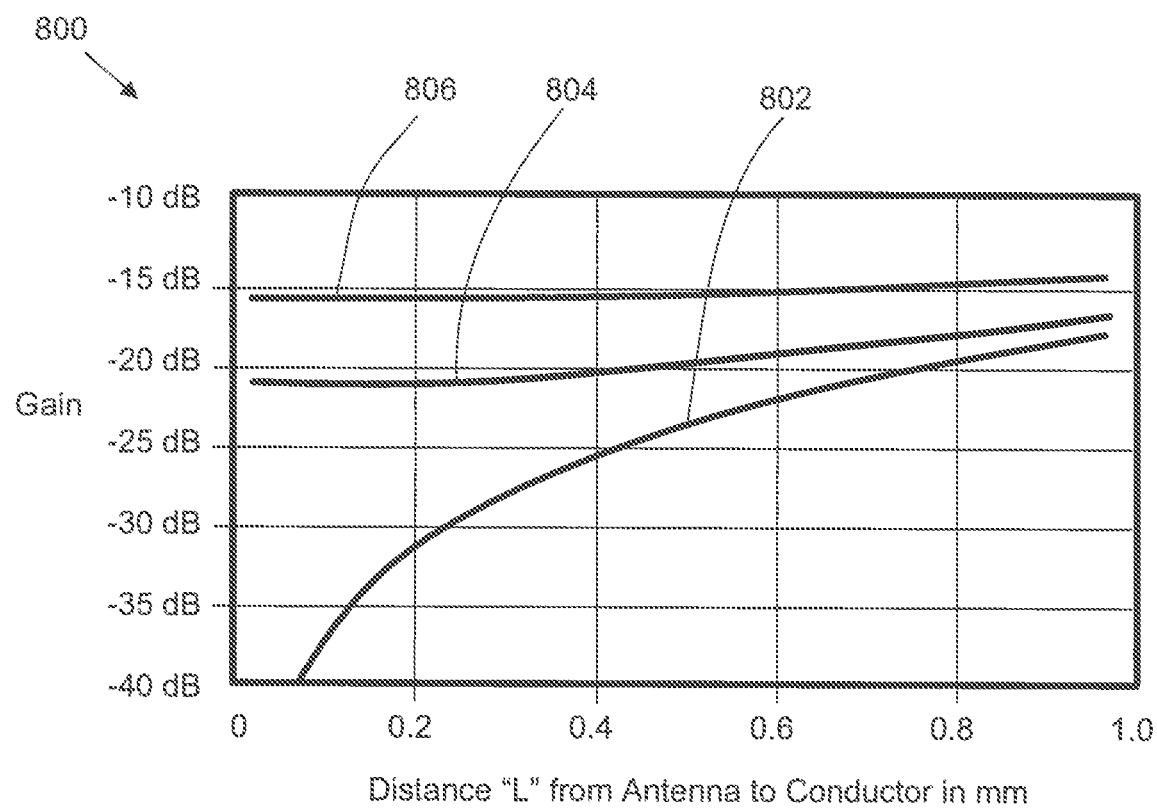
FIG. 8 illustrates a graph antenna gain as a function of metamaterial surface separation from the conductive layer.
Figure 9:
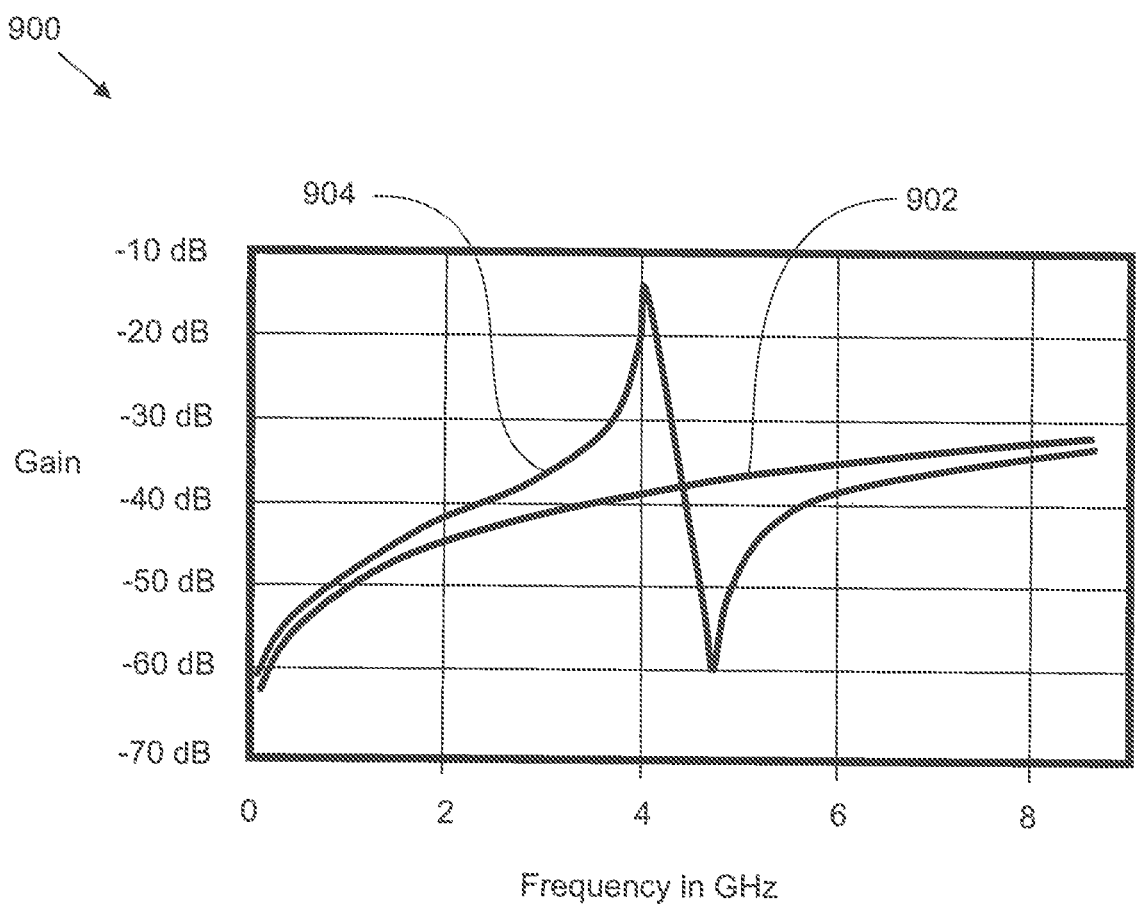
FIG. 9 illustrates a graph 900 of gain verses frequency for antenna structures formed with metamaterials verses antennas without making use of metamaterials.

The embodiments of FIGS. 1-7 have been modeled by simulation using the Landau-Lifshitz-Gilbert-Slonczewski (LLGS) and Maxwell equations for modeling the metamaterial layer 14. FIGS. 8-10 are based on simulations conducted using those equations.

FIG. 8 illustrates a graph 800 of a mathematical simulation result showing how the enhancing of the electromagnetic field near the conductive surfaces for planar antennas results in antenna gain as a function of metamaterial surface separation "L" of the antenna layer 16 to the conductive layer 12. Simulation conditions and parameters for FIG. 8 include: the antenna layer 16 is parallel to the conductor layer 12, the antenna gain is based on the power equation: $W=\frac{1}{2}\epsilon_0 E(r,t) \cdot E(r,t)$ and the resonance frequency is 4.06 GHz. Curve 802 represents the response with no magnetic metamaterial. Curve 804 represents the response with a magnetic metamaterial layer separated from the antenna by 5 μm, and curve 806 represents response with a magnetic metamaterial layer separated from the antenna by 10 μm. From this simulation and the resulting graph 800, it can be seen that the gain of the antenna is significantly improved (at least up to some limit) with increased spacing between the antenna layer 16 and the conductor layer 12.

FIG. 9 illustrates a graph 900 of a gain verses frequency for antenna structures formed with metamaterials verses antennas without making use of metamaterials. Curve 902 is a continuous curve. However, curve 904 exhibits larger gains for frequencies below 4 GHz with a significantly large spike in gain for frequencies around 4 GHz. Again, these curves are the results of simulations using the LLGS equations for modeling the metamaterial layer. For this simulation, steel is used to model the conducting layer, the metamaterial layer is 10 μm thick and there is a space of 100 μm between the antenna layer and the conductive layer. The incoming electromagnetic wave was modeled with a right circular polarization with an incidence angle of θ=0.

Figure 10A:
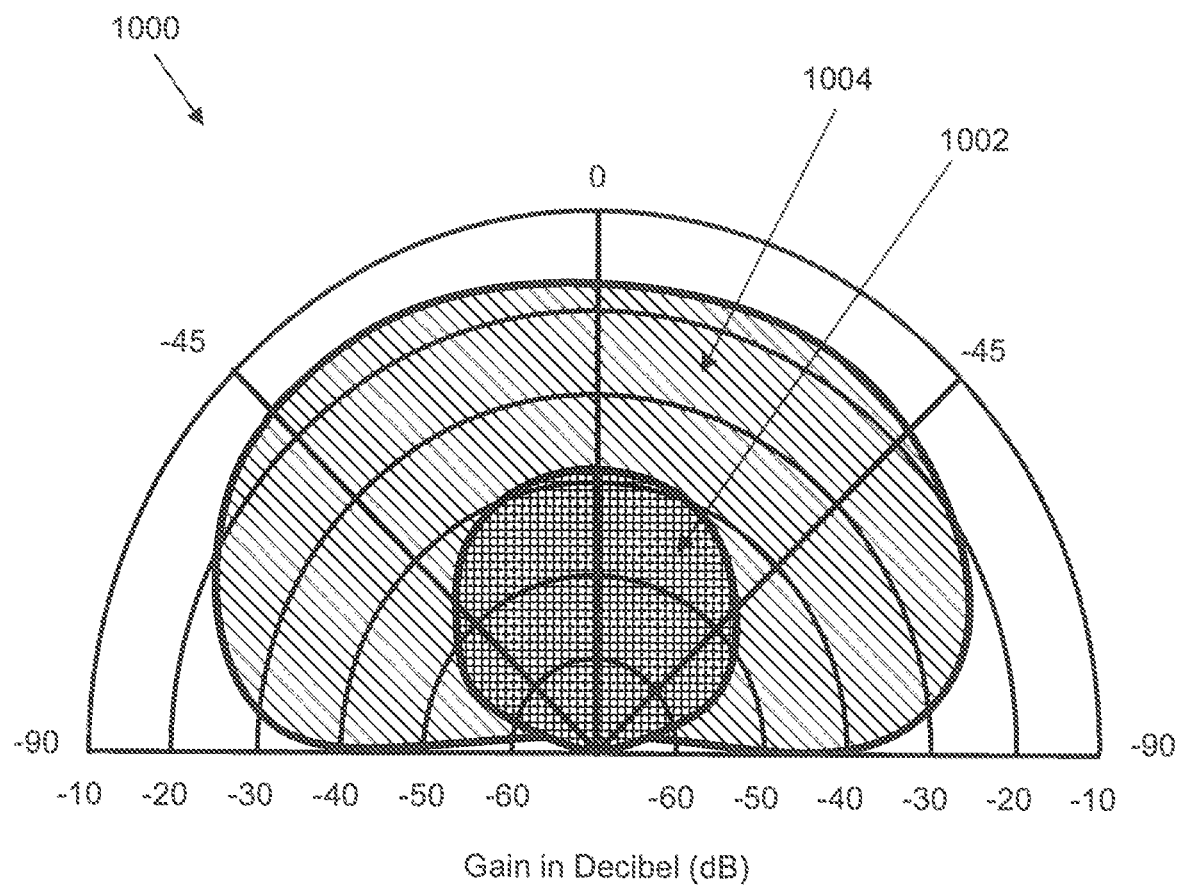
FIG. 10A illustrates a graph of a gain verses angular position for an antenna structure formed with metamaterials verses antennas without making use of metamaterials.

FIG. 10A illustrates a graph 1000 of a gain verses angular position for an antenna structure formed with metamaterials (region 1004) verses antennas without making use of metamaterials (region 1002). The region 1004 with the metamaterial layer has roughly twice the gain as the region 1002 without a metamaterial layer. These regions 1002, 1004 are the results of simulations using the LLGS equations for modeling the metamaterial layer. For this simulation, the frequency of radiation is 5.6 MHz and steel is used to model the conducting layer. The metamaterial layer is 10 μm thick and there is a space of 100 μpm between the antenna layer and the conductive layer. This graph 1000 and simulation indicate that the metamaterial increases gain in all direction and has a flat response over a wide angle due to varying boundary conditions. This graph 1000 also indicates it is possible to produced enhanced omnidirectional antennas with metamaterials.

Figure 10B:
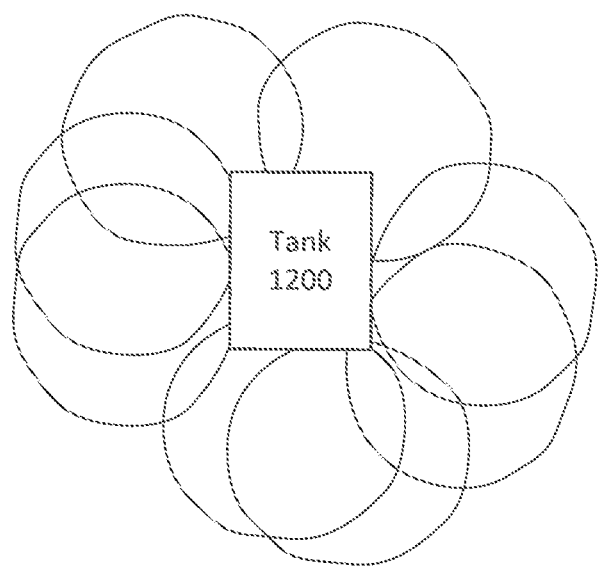
FIG. 10B illustrates an example antenna coverage around a tank that does not use metamaterials.
Figure 10C:
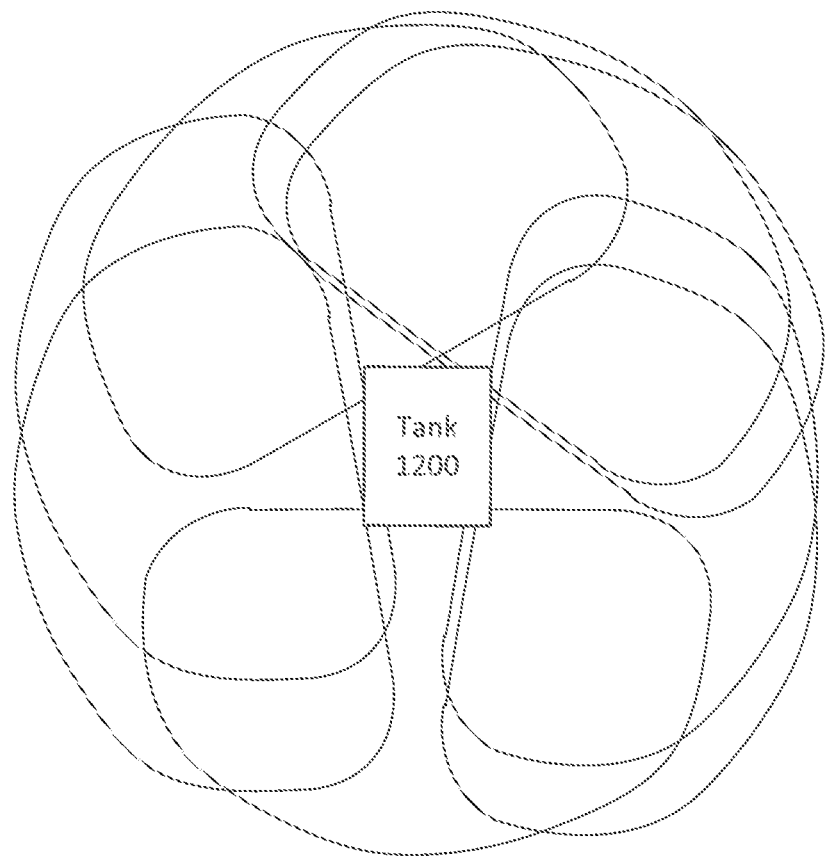
FIG. 10C illustrates an example antenna coverage around a tank that uses metamaterials.

FIG. 10B illustrates an example antenna coverage around a tank 1200 (or any vehicle) that does not use metamaterials and FIG. 10C illustrates an example antenna coverage around a tank 1200 that uses metamaterials. As illustrated, FIG. 10C illustrates one example embodiment that uses multiple metamaterial antennas around the tank 1200 (or any vehicle) that generally provides for 360 degrees of metamaterial antenna range coverage. In other embodiments, metamaterial antennas could be arrange on other surfaces of the tank 1200 including upper surfaces to provide for spherical coverage of the tank 1200 to warn/protect against projectiles approaching from above the tank 1200 or another elevation that is greater than a horizontal elevation. As understood by one of ordinary skill in this art, the tank 1200 (or any vehicle) of FIG. 10B may use various non-metamaterial antennas to provide coverage around the tank 1200 that correspond to a coverage region 1002 (FIG. 10A) for each antenna while the tank 1200 of FIG. 10C may use various metamaterial antennas to provide coverage around the tank 1200 that correspond to a coverage region 1004 (FIG. 10A). One of ordinary skill in this art can readily determine that the coverage about the tank 1200 in FIG. 10C is significantly improved using metamaterial antennas compared to the non-metamaterial antennas of FIG. 10B.

Having discussed the antenna structures formed with metamaterials, their benefits and other characteristics are now discussed. One advantage of antenna structures formed with metamaterials so that they provide for conformal antennas that may be placed on a curved metallic vehicle surfaces. This reduces clutter on the vehicle which may improve a military vehicle's stealth characteristics. Antenna structures formed with metamaterials may also have the advantage of being frequency-tunable based on the shape of the elements forming the array of elements of the metamaterial layer.

Another configuration using an ellipsoidal shaped metamaterial elements 1122 is illustrated in FIGS. 11 and 12. FIG. 11 illustrates a perspective view of an example portion of a metamaterial layer 14 that is an array 1120 of the ellipsoidal shaped metamaterial elements 1122 that are curved ellipsoids in shape. FIG. 12 illustrates a top view of this array 1120 of ellipsoidal shaped metamaterial elements 1122. The antenna layer 16, conductor layer 12 and spacer layer 18 are similar to what was discussed above with reference to FIGS. 1 and 2 and are not repeatedly described here. As illustrated, the ellipsoidal shaped metamaterial elements 1122 of FIG. 11 are curved between a first end 1126 and a second end 1128 of each element and have elliptical cross sections 1130 at their midpoints. The ellipsoidal shaped metamaterial elements 1122 may be constructed out of passive magnetic material(s) with magnetic fields and may have saturation of magnetization values ($M_s$) of 1.02 Tesla (T) with $M_s$ vectors pointing to the right or toward the conducting layer. The dimensions of the ellipsoidal shaped metamaterial elements 1122 and their spacing may be similar to the array discussed above, but can be any suitable values as understood by those of ordinary skill in the art.

The ellipsoidal shaped metamaterial elements 1122 may be formed with any suitable combination of iron, nickel, copper and boron. For example, the metamaterial elements 1122 may be a material that is about 80 percent iron and about 20 percent nickel. Upon fabrication, the metamaterial elements 1122 may be located within other material 1124 (shown in FIG. 12) that surrounds and fills voids between the metamaterial elements 1122. This material 24 may be leftover material used in the fabrication process that is used to produce the ellipsoidal shaped metamaterial elements 1122.

In another embodiment, least some of the array of elements 1120 are formed with metamaterial array elements 1122 having a top end 1128 and a bottom end 1126 with at least some of the array of elements having a cross-sectional area 1130 between the top end 1126 and the bottom end 1128 that is a larger cross-sectional area than a cross-sectional area near either the top end 1126 or the bottom end 1128. In another embodiment, at least some of the array of elements have a perimeter 1130 between the top end 1128 and the bottom 1126 that is a larger perimeter than perimeters near either the top end 1128 or the bottom end 1126.

Figure 13:
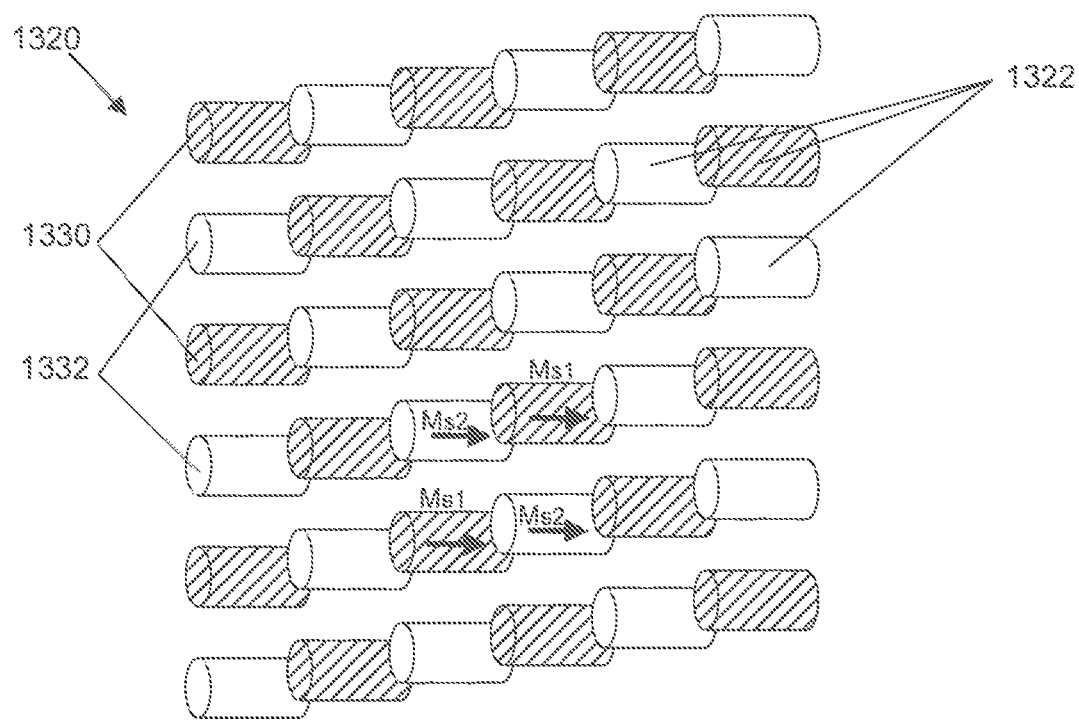
FIG. 13 example isometric view of a checkerboard pattern array of elements forming the metamaterial layer.
Figure 14:
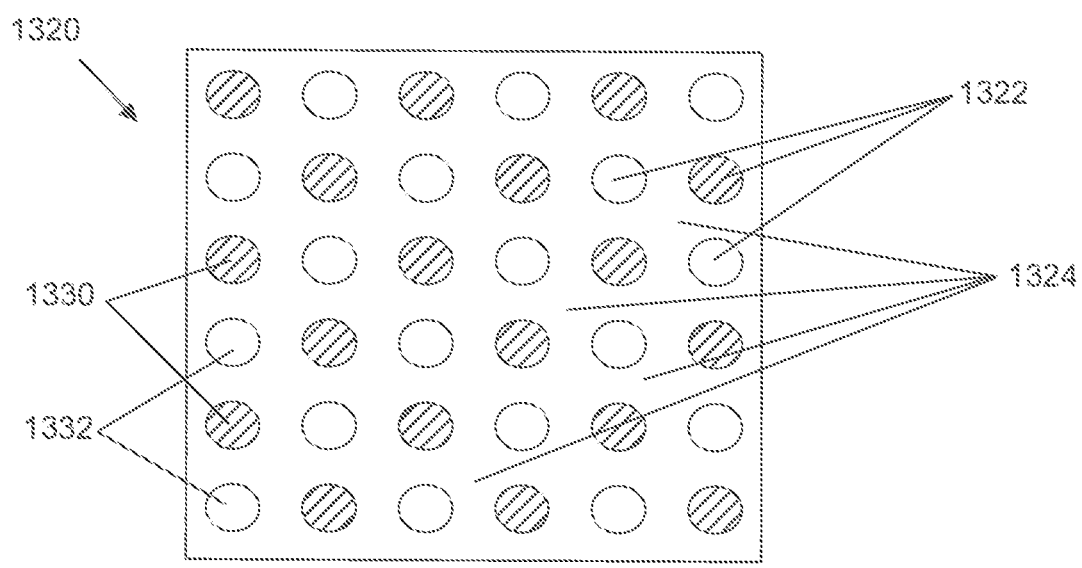
FIG. 14 illustrates an example top view of the checkerboard pattern array of elements of FIG. 13 forming the metamaterial layer.

Another configuration using a "checkerboard pattern" of metamaterial element 1322 is illustrated in FIGS. 13 and 14. FIG. 13 illustrates a perspective view of an example portion of a checkerboard patterned metamaterial array 1320 or layer 14 that is a two-dimensional array 1320 of elements 1322 that are cylindrical in shape. FIG. 14 illustrates a top view of this array 1320 metamaterial elements 1322. The antenna layer 16, conductor layer 12 and spacer layer 18 are similar to what was discussed above and are not repeated here for the sake of clarity and brevity. As illustrated, the two-dimensional array 1320 of elements 1322 is formed by alternating darkly shaded elements 1330 and lightly shaded elements 1332. In one embodiment, the darkly shaded elements 1330 may be formed from passive magnetic material(s) to have magnetic fields having first saturation of magnetization values ($M_{s1}$) with $M_{s1}$ vectors pointing to the right or toward the conducting layer 12. The lightly shaded elements 1332 may be formed from passive magnetic material(s) to have magnetic fields having a second saturation of magnetization values ($M_{s2}$) with $M_{s2}$ vectors pointing to the right or toward the conducting layer 12.

Forming a checkerboard patterned metamaterial array with two different materials having different magnetization values may improve the characteristics of an overall conformal antenna utilizing metamaterials. For example, such an antenna may have improved gain in a desired direction and/or an overall improvement in antenna gain. In some embodiments, the darkly shaded elements 1330 may be fabricated to be composed of a first combination of iron, knuckle, cobalt, and NiFe permalloy, and/or other suitable materials and the lightly shaded elements 1332 may be fabricated to be composed of a first combination of iron, knuckle, cobalt, an NiFe permalloy, and/or other suitable materials. Alternative environments may be fabricated alternating rows of different metamaterial elements, a striped pattern, rather than a checkerboard pattern.

Methods that can be implemented in accordance with the disclosed subject matter, may be at least partially implemented with reference to the following flow charts. While, for purposes of simplicity of explanation, the methods are shown and described as a series of blocks, it is to be understood and appreciated that the disclosed aspects are not limited by the number or order of blocks, as some blocks can occur in different orders and/or at substantially the same time with other blocks from what is depicted and described herein. Moreover, not all illustrated blocks can be required to implement the disclosed methods. It is to be appreciated that the functionality associated with the blocks can be implemented by software, hardware, a combination thereof, or any other suitable means (e.g. device, system, process, component, and so forth). Additionally, it should be further appreciated that in some embodiments the disclosed methods are capable of being stored on an article of manufacture to facilitate transporting and transferring such methods to various devices. Those skilled in the art will understand and appreciate that the methods could alternatively be represented as a series of interrelated states or events, such as in a state diagram.

Figure 15:
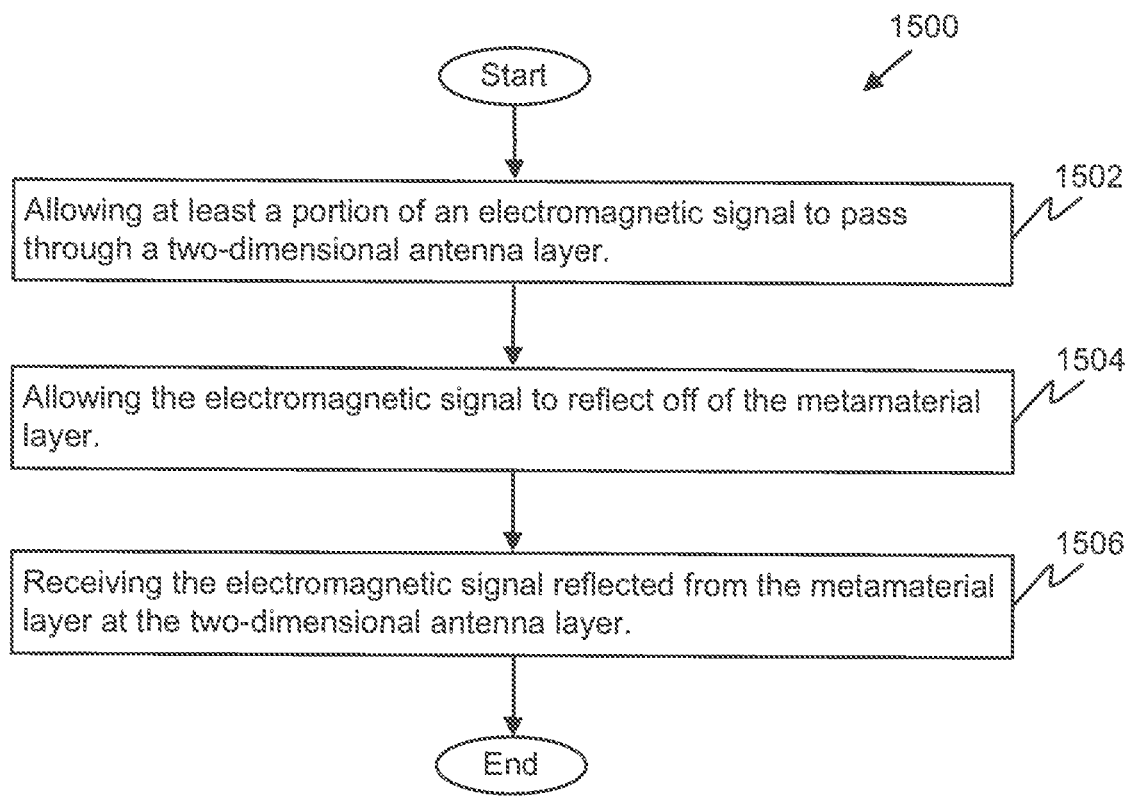
FIG. 15 illustrates an example view of a method of receiving an electromagnetic signal with a conformal antenna structure formed with a metamaterial.

Thus, various embodiments can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, machine-readable device, computer-readable carrier, computer-readable media, machine-readable media, computer-readable (or machine-readable) storage/communication media. For example, computer-readable media can comprise, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media. Of course, those skilled in the art will recognize many modifications can be made to this configuration without departing from the scope or spirit of the various embodiments FIG. 15 illustrates some example actions of a method 1500 operating an antenna that utilizes metamaterials. The method 1500 begins by allowing an electromagnetic signal to pass through a two-dimensional antenna layer, at 1502, spaced from a flexible metamaterial layer previously placed onto a surface of a vehicle. After the electromagnetic signal passes through the antenna layer, the electromagnetic signal is allowed to reflect off of the metamaterial layer, at 1504. The metamaterial layer may be formed with a two-dimensional array of elements having a passive magnetic property. In some embodiments, the array of elements is formed with elongated individual elements each having a top end and a bottom end, wherein the elongated individual elements have curved outer surfaces between the top end and the bottom end. After the electromagnetic signal is reflected from the metamaterial layer back toward the two-dimensional antenna layer, the electromagnetic signal is received at the antenna, at 1506.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims. Accordingly, the disclosure is intended to embrace all such alterations, modifications, and variations that fall within the scope of this application, including the appended claims.

Moreover, the description and illustration of the invention is an example and the invention is not limited to the exact details shown or described. References to "the preferred embodiment", "an embodiment", "one example", "an example" and so on, indicate that the embodiment(s) or example(s) so described may include a particular feature, structure, characteristic, property, element, or limitation, but that not every embodiment or example necessarily includes that particular feature, structure, characteristic, property, element, or limitation. Additionally, references to "the preferred embodiment", "an embodiment", "one example", "an example" and the like, are not to be construed as preferred or advantageous over other embodiments or designs. Rather, use of the words "the preferred embodiment", "an embodiment", "one example", "an example" and the like are intended to present concepts in a concrete fashion.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. An antenna structure with a metamaterial comprising:
   a flexible metamaterial layer having a metamaterial thickness adapted to be attached to a conducting surface of a vehicle, wherein the metamaterial layer is formed with a two-dimensional array of elements having a passive magnetic property, wherein the array of elements is formed with elongated individual elements each having a top end and a bottom end, wherein at least some of the array of elements have a perimeter between the top end and the bottom that is a longer perimeter than perimeters at either the top end and the bottom end, and wherein the elongated individual elements have curved outer surfaces between the top end and the bottom end;
   a two-dimensional antenna layer adapted to receive electromagnetic signals; and
   a spacer layer located between the metamaterial layer and the antenna layer separating the metamaterial layer and the antenna layer.

2. The antenna structure with a metamaterial of claim 1 wherein individual elements of the array of elements have rounded top ends and rounded bottom ends.

3. The antenna structure with a metamaterial of claim 2 wherein individual elements of the array of elements have flat top ends and flat bottom ends.

4. The antenna structure with a metamaterial of claim 1 wherein individual elements of the array of elements are elliptical in shape with cross-sections between the bottom end and the top end that have perimeters that are curved without any flat segments.

5. The antenna structure with a metamaterial of claim 1 wherein a distance "L" between the antenna layer and the metamaterial layer is between 140 micrometers (um) and 40 um.

6. The antenna structure with a metamaterial of claim 1 wherein a thickness "H" of the metamaterial layer is between 5 um and 15 micrometers.

7. The antenna structure with a metamaterial of claim 1 wherein "L" is a distance between the antenna layer and the metamaterial layer, wherein "H" is a thickness of the metamaterial layer, and wherein a ratio of L/H is greater than 5.

8. The antenna structure with a metamaterial of claim 1 wherein the "height" of one of the individual elements of the array of elements is "H" and is about 50 nanometers (nm), and wherein the radius of one of the individual elements of the array of elements is "R" and is about 10 nm.

9. The antenna structure with a metamaterial of claim 8 wherein a ratio of height, "H", to radius, "R", is H/R for one of the individual elements of the array of elements is greater than 4 (four).

10. The antenna structure with a metamaterial of claim 1 wherein the metamaterial elements are spaced apart about 100 nm in the "X" direction and are spaced apart about 30 nm in the "Y" direction.

11. The antenna structure with a metamaterial of claim 1 wherein the metamaterial elements are spaced apart about in the "X" direction three (3) times further than the metamaterial elements are spaced apart in the "Y" direction.

12. The antenna structure with a metamaterial of claim 1 wherein at least one metamaterial element is formed out of a nanotube.

13. The antenna structure with a metamaterial of claim 1 wherein at least one metamaterial element is formed with a passive magnetic material with a magnetic field with an $M_s$ vector pointing toward the conducting layer.

14. The antenna structure with a metamaterial of claim 1 wherein the antenna structure is configured to receive and at least one frequency between 900 MHz to 10 GHz.

15. An antenna utilizing a metamaterial adapted to be attached adjacent to a conductive layer of a vehicle comprising:
   a flexible metamaterial sheet of elongated elements having a passive magnetic property and curved outer surfaces between a top end and a bottom end of each element, and wherein at least some of the elongated elements have curved perimeter cross-sections between the top end and the bottom end that have larger perimeter lengths than cross section perimeter lengths at either the top end and the bottom end;

a two-dimensional antenna layer adapted to receive and transmit electromagnetic signals; and a spacer layer located between the metamaterial layer and the antenna layer.

16. The antenna utilizing a metamaterial of claim 15 wherein the individual elements of the array of elements are elliptical in shape with cross-sections between the bottom end and the top end that have cross-sectional perimeters that are curved without any flat segments on the parameters.

17. The antenna utilizing a metamaterial of claim 15 wherein a distance "L" between the antenna layer and the metamaterial layer is between 140 micrometers (um) and 40 um, wherein a thickness "H" of the metamaterial layer is between 5 um and 15 micrometers, and wherein a ratio of L/H is greater than 4 (four).

18. A method comprising:

allowing at least a portion of an electromagnetic signal to pass through a two-dimensional antenna layer spaced from a flexible metamaterial layer previously placed onto a surface of a vehicle;

after the electromagnetic signal passes through the antenna layer, allowing the electromagnetic signal to reflect off of the metamaterial layer, wherein the metamaterial layer is formed with a two-dimensional array of elements having a passive magnetic property, wherein at least some of the array of elements is formed with elements having a top end and a bottom end, and wherein at least some of the array of elements have a cross-sectional area between the top end and the bottom end that is a larger cross-sectional area than at a cross-sectional area at either the top end and the bottom end; and receiving the electromagnetic signal reflected from the metamaterial layer at the two-dimensional antenna layer.

19. The method of claim 18, further comprising:

after the electromagnetic signal passes through the antenna layer, allowing the electromagnetic signal to pass through a spacer layer located between the metamaterial layer and the antenna layer separating the metamaterial layer and the antenna layer.

20. The method of claim 18, wherein the array of elements is formed with elongated individual elements each having a top end and a bottom end, and wherein the elongated individual elements have curved outer surfaces between the top end and the bottom end.

* * * * *